(12) United States Patent
Li et al.

(10) Patent No.: US 11,652,444 B2
(45) Date of Patent: May 16, 2023

(54) INDUCTOR TOPOLOGY FOR PHASE NOISE REDUCTION

(71) Applicant: Apple Inc., Cupertino, CA (US)

(72) Inventors: Yi-An Li, Sunnyvale, CA (US); Ahmed I. Hussein, San Jose, CA (US); Yi Zhao, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/479,774

(22) Filed: Sep. 20, 2021

(65) Prior Publication Data

US 2023/0092992 A1  Mar. 23, 2023

(51) Int. Cl.
*H03B 5/08* (2006.01)
*H03L 7/099* (2006.01)

(52) U.S. Cl.
CPC ............... *H03B 5/08* (2013.01); *H03L 7/099* (2013.01); *H03B 2200/009* (2013.01)

(58) Field of Classification Search
CPC ........................................................ H03B 5/08
USPC ..................................................... 331/107 R
See application file for complete search history.

(56) References Cited

U.S. PATENT DOCUMENTS

| | | | |
|---|---|---|---|
| 7,432,794 B2 | 10/2008 | Mattsson | |
| 7,535,330 B2 | 5/2009 | Erickson et al. | |
| 8,183,971 B2 | 5/2012 | Le Guillou et al. | |
| 9,543,068 B2 | 1/2017 | Aboush et al. | |
| 10,804,847 B2 | 10/2020 | Komijani et al. | |
| 2008/0284534 A1 | 11/2008 | Samir | |
| 2015/0214891 A1 | 7/2015 | Shi et al. | |
| 2017/0179881 A1* | 6/2017 | Caffee ...................... | H03B 5/08 |
| 2018/0102737 A1* | 4/2018 | Wu ...................... | H01L 23/5227 |
| 2019/0363565 A1 | 11/2019 | Graham et al. | |

FOREIGN PATENT DOCUMENTS

CN           112002539 A          11/2020

OTHER PUBLICATIONS

Extended European Search Report for European Patent Application No. 22169911.9 dated Oct. 19, 2022; 10 pgs.
Extended European Search Report for European Patent Application No. 22196246 dated Jan. 4, 2023; 8 pgs.

* cited by examiner

*Primary Examiner* — Joseph Chang
(74) *Attorney, Agent, or Firm* — Fletcher Yoder PC

(57) ABSTRACT

A voltage-controlled oscillator may include an inductor. The inductor may include a first coil coupled to an electronic component. The inductor may include a first coil coupled to the first circuit component, a second coil coupled to the first circuit component via a junction and being in parallel with the first coil, and a shared circuit path coupled to the second circuit component, the first coil, and the second coil, the shared circuit path overlapping the junction. The inductor may be configured to reduce phase noise generated by the electronic component.

20 Claims, 9 Drawing Sheets

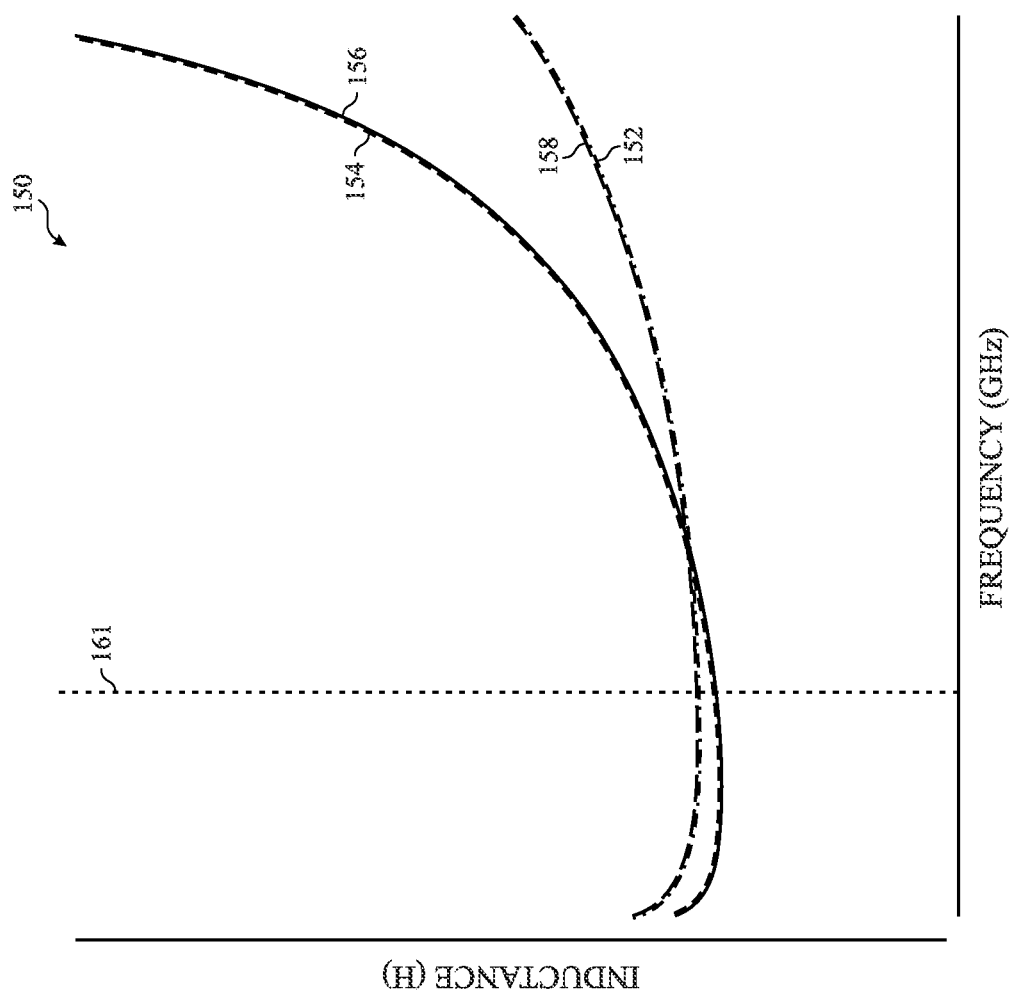

ized upon reading the following detailed description and
INDUCTOR TOPOLOGY FOR PHASE NOISE REDUCTION

BACKGROUND

The present embodiments relate generally to inductors, and more specifically, inductors of a voltage-controlled oscillators (VCOs).

In a mobile communication device, a transceiver may transmit and receive wireless signals. The transceiver may include a voltage-controlled oscillator (VCO) that modifies a frequency of a transmission or received signal. However, the VCO may generate phase noise (e.g., frequency-domain representations of random fluctuations in a phase of the transmission or received signal, corresponding to time-domain deviations from perfect periodicity) that may affect performance of the transceiver and a quality of the transmission or received signal.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, an inductor may include a first terminal, a second terminal, and a shared branch coupled to the second terminal. The inductor may further include a first coil coupled to the first terminal that extends in a counter-clockwise direction from the first terminal to the shared branch. The inductor may further include a second coil coupled to the first terminal that extends in a clockwise direction from the first terminal to the shared branch, where the first coil is symmetrical with the second coil about the shared branch.

In another embodiment, an electronic device may include one or more antennas. The electronic device may also include a transceiver coupled to the one or more antennas. The transceiver may include first circuitry, second circuitry, and an inductor. The inductor may have a first coil and a second coil coupled to the first circuitry and a shared branch coupled to the first coil and the second coil that bisects the inductor and is coupled to the second circuitry, where the first coil is in parallel with the second coil.

In yet another embodiment, a voltage-controlled oscillator may include a first circuit component, a second circuit component, and an inductor. The inductor may include a first coil coupled to the first circuit component, a second coil coupled to the first circuit component via a junction and being in parallel with the first coil, and a shared circuit path coupled to the second circuit component, the first coil, and the second coil, the shared circuit path overlapping the junction.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

FIG. 8 is a plot showing an inductance of the inductor of FIG. 5 and an inductance of the inductor of FIG. 6, according to embodiments of the present disclosure;

DETAILED DESCRIPTION OF SPECIFIC EMBODIMENTS

Figure 1:
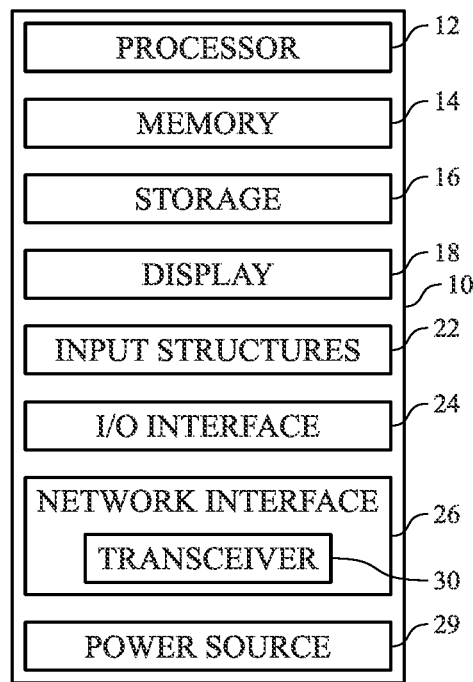
FIG. 1 is a block diagram of an electronic device, according to embodiments of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on.

This disclosure is directed towards reducing phase noise in a voltage-controlled oscillator (VCO), and more specifically by using an inductor located within the VCO. In particular, increasing power consumption and/or a quality factor of the inductor may result in lowering phase noise. The quality factor of the inductor is a ratio of inductive reactance of the inductor to resistance at a given frequency and a measure of efficiency of the inductor. That is, the higher the quality factor of the inductor, the closer the inductor may behave as an ideal inductor.

Lower VCO phase noise may be achieved by designing the inductor to increase power consumption. To increase the power consumption of the inductor, an inductance of the inductor should be reduced by decreasing the inner diameter of one or more coils in the inductor. However, as the inner diameter becomes smaller, a quality factor of the inductor decreases, which may counteract the benefit of shrinking the inductance by increasing phase noise. Moreover, assuming that the inductor has a series figure-8 (or 8-shaped) topology to provide first-order flux cancellation, decreasing both the inner diameters of the coils of the figure-8 may lead to an even lower quality factor. By way of example, if two coils of the series figure-8 inductor have the same inductance, the total inductance of the inductor is the sum of the inductances of the two coils.

The presently disclosed embodiments provide an inductor topology that may achieve a lower inductance and a higher quality factor (e.g., compared to a series figure-8 configuration) to reduce phase noise, while still providing flux cancellation. In the disclosed parallel figure-8 inductor configuration, the coils are placed in parallel to form the inductor with a total inductance approximately equal to half of the inductance of each coil (assuming each coil has the same inductance). This may be compared to a series figure-8 configuration, in which two coils are placed in series to form the inductor, where the total inductance of the inductor is the sum of the inductance of each coil. Since each coil of the proposed inductor has an inductance and inner diameter that may be larger (e.g., compared to the series figure-8 configuration) due to the parallel figure-8 inductor configuration, a greater quality factor of the inductor is realized. This may lead to lower phase noise due to the decreased inductance and increased quality factor.

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive data between one another. It should be noted that FIG. 1 is merely one example of a particular implementation and is intended to illustrate the types of components that may be present in electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, Calif.), a portable electronic or handheld electronic device such as a wireless electronic device or smartphone (e.g., in the form of a model of an iPhone® available from Apple Inc. of Cupertino, Calif.), a tablet (e.g., in the form of a model of an iPad® available from Apple Inc. of Cupertino, Calif.), a wearable electronic device (e.g., in the form of an Apple Watch® by Apple Inc. of Cupertino, Calif.), and other similar devices. It should be noted that the processor 12 and other related items in FIG. 1 may be generally referred to herein as "data processing circuitry." Such data processing circuitry may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector provided by Apple Inc. of Cupertino, Calif., a universal serial bus (USB), or other similar connector and protocol. The network interface 26 may include, for example, one or more interfaces for a personal area network (PAN), such as an ultra-wideband (UWB) or a BLUETOOTH® network, for a local area network (LAN) or wireless local area network (WLAN), such as a network employing one of the IEEE 802.11x family of protocols (e.g., WI-FI®), and/or for a wide area network (WAN), such as any standards related to the Third Generation Partnership Project (3GPP), including, for example, a $3^{rd}$ generation (3G) cellular network, universal mobile telecommunication system (UMTS), 4th generation (4G) cellular network, long term evolution (LTE®) cellular network, long term evolution license assisted access (LTE-LAA) cellular network, 5th generation (5G) cellular network, and/or New Radio (NR) cellular network, a satellite network, and so on. In particular, the network interface 26 may include, for example, one or more interfaces for using a Release-15 cellular communication standard of the 5G specifications that include the millimeter wave (mm Wave) frequency range (e.g., 24.25-300 gigahertz (GHz)) and/or any other cellular communication standard release (e.g., Release-16, Release-17, any future releases) that define and/or enable frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The transceiver 30 may further include an inductor, where the inductor may be coupled to any suitable circuitry of the transceiver 30 to reduce phase noise of the circuitry. The power source 29 of the electronic device 10 may include any suitable source of power, such as a rechargeable lithium polymer (Li-poly) battery and/or an alternating current (AC) power converter. In certain embodiments, the electronic device 10 may take the form of a computer, a portable electronic device, a wearable electronic device, or other type of electronic device.

Figure 2:
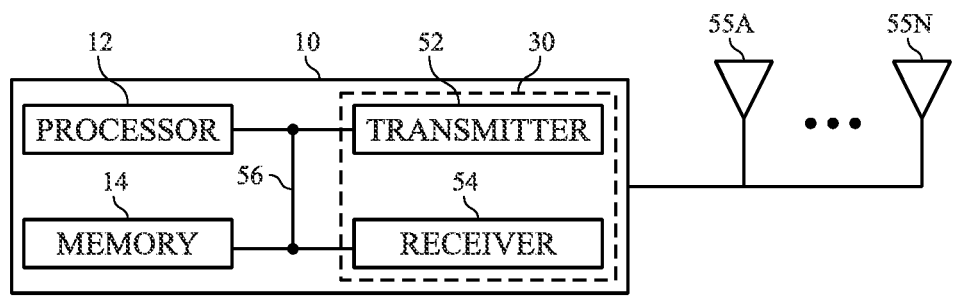
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or antennas 55 (illustrated as 55A-55N, collectively referred to as an antenna 55) may be communicatively coupled directly or indirectly (e.g., through or via another component, a communication bus, a network) to one another to transmit and/or receive data between one another.

The electronic device 10 may include the transmitter 52 and/or the receiver 54 that respectively enable transmission and reception of data between the electronic device 10 and an external device via, for example, a network (e.g., including base stations) or a direct connection. As illustrated, the transmitter 52 and the receiver 54 may be combined into the transceiver 30. The electronic device 10 may also have one or more antennas 55A-55N electrically coupled to the transceiver 30. The antennas 55A-55N may be configured in an omnidirectional or directional configuration, in a single-beam, dual-beam, or multi-beam arrangement, and so on. Each antenna 55 may be associated with a one or more beams and various configurations. In some embodiments, multiple antennas of the antennas 55A-55N of an antenna group or module may be communicatively coupled a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figure 3:
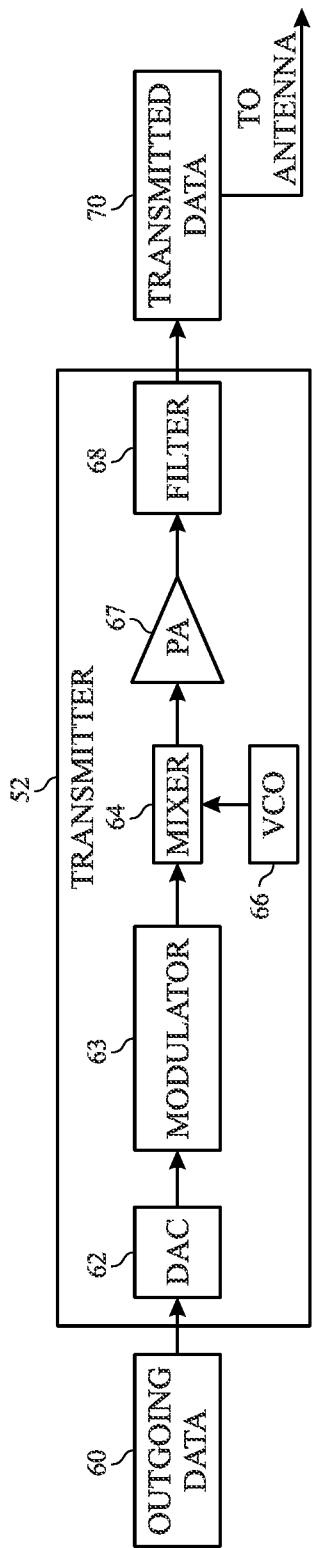
FIG. 3 is a schematic diagram of a transmitter of the electronic device of FIG. 1, according to embodiments of the present disclosure.

As mentioned above, the transceiver 30 of the electronic device 10 may include a transmitter and a receiver that are coupled to at least one antenna to enable the electronic device 10 to transmit and receive wireless signals. FIG. 3 is a block diagram of a transmitter 52 (e.g., transmit circuitry) that may be part of the transceiver 30, according to embodiments of the present disclosure. As illustrated, the transmitter 52 may receive outgoing data 60 in the form of a digital signal to be transmitted via the one or more antennas 55. A digital-to-analog converter (DAC) 62 of the transmitter 52 may convert the digital signal to an analog signal, and a modulator 63 may combine the converted analog signal with a carrier signal. A mixer 64 may modify the frequency of the carrier signal via a voltage-controlled oscillator 66 (VCO). The VCO 66 is an oscillator whose oscillation frequency is controlled by voltage. The VCO 66 may include one or more circuit components, such as one or more resistors, capacitors, inductors (including an inductor as described herein to reduce phase noise in an input signal received by the VCO 66 to output an output signal), transistors, diodes, and the like. In some embodiments, the VCO 66 may include a digitally controlled oscillator (DCO). The DCO may refer to the VCO 66 driven by the carrier signal provided by the DAC 62.

A power amplifier (PA) 67 receives the radio frequency signal from the mixer 64, and may amplify the modulated signal to a suitable level to drive transmission of the signal via the one or more antennas 55. A filter 68 (e.g., filter circuitry and/or software) of the transmitter 52 may then remove undesirable noise from the amplified signal to generate transmitted data 70 to be transmitted via the one or more antennas 55. The filter 68 may include any suitable filter or filters to remove the undesirable noise from the amplified signal, such as a bandpass filter, a bandstop filter, a low pass filter, a high pass filter, and/or a decimation filter. Additionally, the transmitter 52 may include any suitable additional components not shown, or may not include certain of the illustrated components, such that the transmitter 52 may transmit the outgoing data 60 via the one or more antennas 55. For example, the transmitter 52 may include an additional mixer and/or a digital up converter (e.g., for converting an input signal from a baseband frequency to an intermediate frequency). As another example, the transmitter 52 may not include the filter 68 if the power amplifier 67 outputs the amplified signal in or approximately in a desired frequency range (such that filtering of the amplified signal may be unnecessary).

Figure 4:
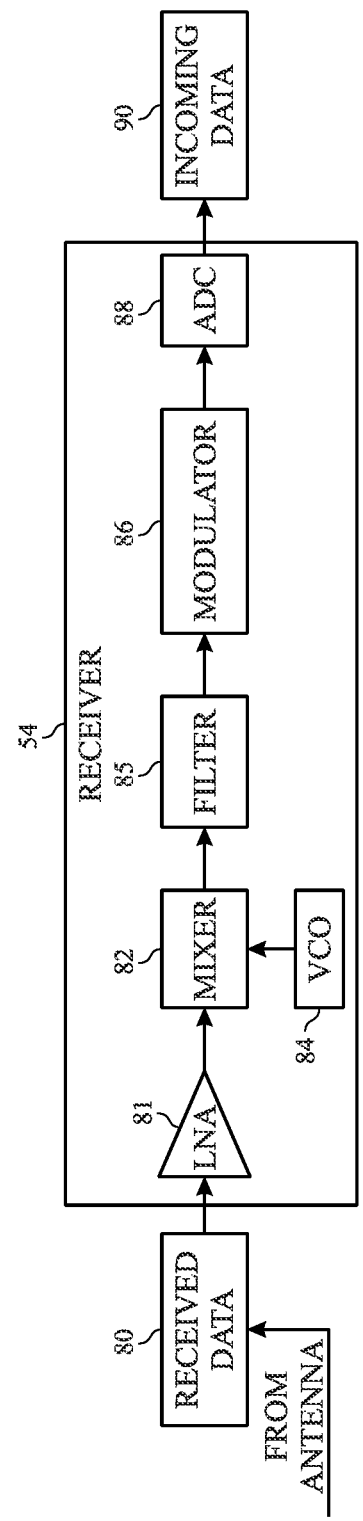
FIG. 4 is a schematic diagram of a receiver of the electronic device of FIG. 1, according to embodiments of the present disclosure.

FIG. 4 is a schematic diagram of a receiver 54 (e.g., receive circuitry) that may be part of the transceiver 30, according to embodiments of the present disclosure. As illustrated, the receiver 54 may receive received data 80 from the one or more antennas 55 in the form of an analog signal. A low noise amplifier (LNA) 81 may amplify the received analog signal to a suitable level for the receiver 54 to process. A mixer 82 may modify the frequency of the amplified signal via a voltage-controlled oscillator 84 (VCO). The VCO 84 may be the same as or similar to the VCO 66 of the transmitter 52 described above. A filter 85 (e.g., filter circuitry and/or software) may remove undesired noise from the signal, such as cross-channel interference. The filter 85 may also remove additional signals received by the one or more antennas 55 that are at frequencies other than the desired signal. The filter 85 may include any suitable filter or filters to remove the undesired noise or signals from the received signal, such as a bandpass filter, a bandstop filter, a low pass filter, a high pass filter, and/or a decimation filter. A demodulator 86 may remove a radio frequency envelope and/or extract a demodulated signal from the filtered signal for processing. An analog-to-digital converter (ADC) 88 may receive the demodulated analog signal and convert the signal to a digital signal of incoming data 90 to be further processed by the electronic device 10. Additionally, the receiver 54 may include any suitable additional components not shown, or may not include certain of the illustrated components, such that the receiver 54 may receive the received data 80 via the one or more antennas 55. For example, the receiver 54 may include an additional mixer and/or a digital down converter (e.g., for converting an input signal from an intermediate frequency to a baseband frequency).

Embodiments herein provide an inductor topology that reduces phase noise. In the disclosed parallel figure-8 inductor configuration, two coils of an inductor are placed in parallel, such that the total inductance of the inductor is approximately half of the inductance of each coil (when each coil has equivalent inductance). Since each coil's inductance and inner diameter may be larger (e.g., when compared to a series figure-8 inductor configuration) due to the parallel figure-8 inductor configuration, the quality factor of the inductor may be improved. That is, the series figure-8 inductor configuration may have two coils placed in series, and, as such, the total inductance of the series figure-8 inductor may be the sum of the inductance of each coil. As such, the parallel figure-8 inductor configuration may produce lower phase noise due to decreased inductance and increased quality factor.

Figure 5:
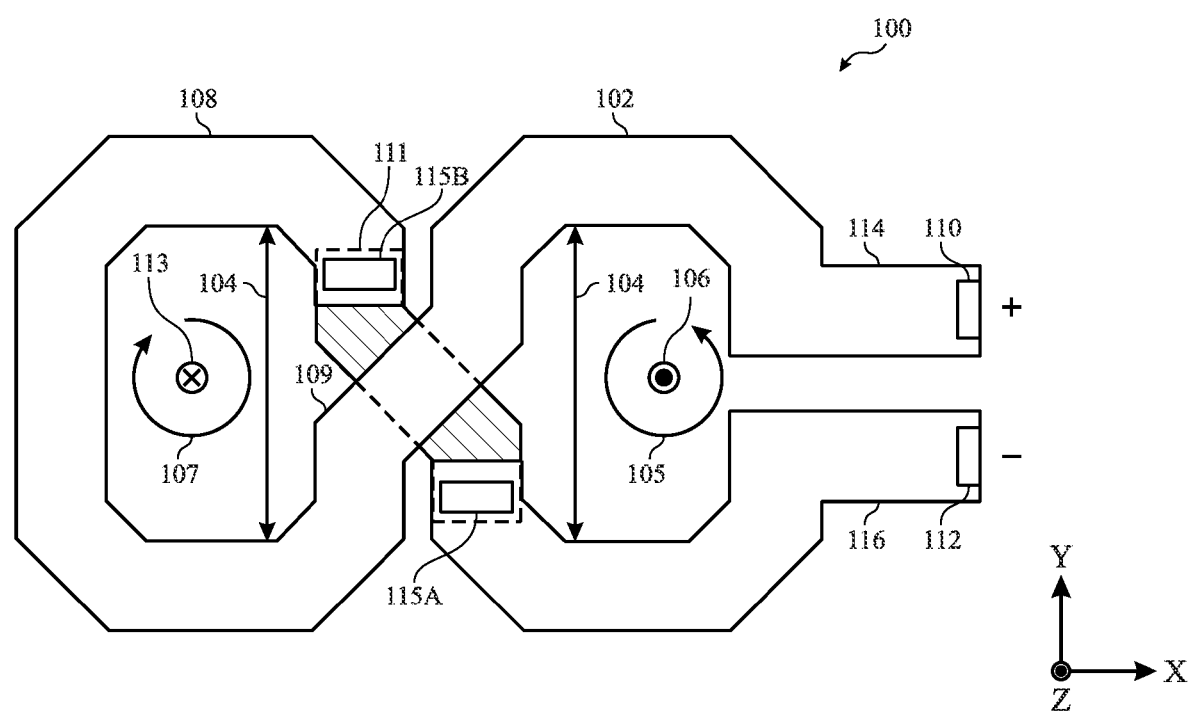
FIG. 5 illustrates an inductor with two coils in series in a figure-8 configuration.

With the foregoing in mind, and for the sake of comparison, FIG. 5 illustrates an inductor 100 with two coils in series in a figure-8 configuration. A first series coil 102 may have an inner diameter 104. The inner diameter 104 may be greater than 1 micron, such as between 5 microns and 80 microns, 30 microns and 70 microns, 40 microns and 60 microns, 45 microns and/or 55 microns. The inner diameter 104 of the first series coil 102 may define an inductance L of the first series coil 102. The first series coil 102 may produce a magnetic flux 106 (e.g., in a positive direction along a z-axis or "out of" the page or sheet of FIG. 5) when a current is applied to the first series coil 102 (e.g., in a counterclockwise direction 105). The first series coil 102 may be in series with a second series coil 108, where the second series coil 108 is coupled to the first series coil 102 via a first junction 109 and a second junction 111. The second series coil 108 may receive the current from the first series coil 102 via the first junction 109 and complete the circuit via the second junction 111 Furthermore, the second junction 111 may overlap (e.g., be disposed above or on a different x-y plane with respect to the z-axis than) the first junction 109, though in alternative embodiments, the first junction 109 may overlap the second junction 111. The second junction 111 may be coupled to the first series coil 102 via a connection 115A. That is, the connection 115A may be disposed between and/or include the x-y plane on which the first series coil 102 is disposed and the x-y plane on which the second junction 111 is disposed. Similarly, the second junction 111 may be coupled to the second series coil 108 via a connection 115B. That is, the second connection 115B may be disposed between and/or include the x-y plane on which the second series coil 108 is disposed and the x-y plane on which the second junction 111 is disposed.

The second series coil 108 may have an approximately identical inner diameter to the inner diameter 104. Accordingly, the inner diameter 104 of the second series coil 108 may define the same inductance L as that of the first series coil 102. The second series coil 108 may produce a magnetic flux 113 equal in magnitude but opposite in direction (e.g., in a negative direction along the z-axis or "into" the page or sheet of FIG. 5) with respect to the magnetic flux 106 when the current is applied to the second series coil 108 (e.g., in a clockwise direction 107). The magnetic flux 106 of the first series coil 102 may be equal in magnitude and opposite in direction to the magnetic flux 113 of the second series coil 108. This may lead to flux cancellation of the magnetic fluxes 106, 113 produced by the current traveling through each coil, respectively. In some embodiments, the directions of the magnetic fluxes 106, 113 along the z-axis of the first series coil 102 and the second series coil 108 may be switched.

In some embodiments, the first series coil 102 and the second series coil 108 may be coupled to one or more circuit components (e.g., a resistor, capacitor, additional inductor, transistor, diode, or the like) of the VCO 66 of the transmitter 52, though, in additional or alternative embodiments, the first series coil 102 and the second series coil 108 may be coupled to any other suitable component to reduce phase noise. For example, when the inductor 100 is coupled in series, a first circuit component may provide or output the current to the inductor 100 via a positively polarized trace 110 (e.g., a positive pin or terminal), and the current may be sent to a second circuit component via a negatively polarized trace 112 (e.g., a negative pin or terminal). In cases where the inductor 100 is coupled in parallel, the first circuit component and the second component may be a single component. The first series coil 102 may be directly coupled to the positively polarized trace 110 and the negatively polarized trace 112 (e.g., without any intermediate circuitry or component between the first series coil 102 and the traces of the electronic component), while the second series coil 108 may not be directly coupled to the positively polarized trace 110 and the negatively polarized trace 112. That is, an input 114 of the first series coil 102 may be coupled to the positively polarized trace 110 and an output 116 may be coupled to the negatively polarized trace 112.

As discussed above, it is desired to reduce the phase noise of the VCO 66 and/or the VCO 84. The phase noise in decibels relative to carrier (dBc) over Hertz (Hz) as dBc/Hz may be determined using Equation 1 below:

$$\mathcal{L}(\Delta\omega) = 10\log_{10}\left(\frac{KT}{2Q_l^2 P_{DC}} \frac{1}{\alpha_I \alpha_V}(1+\gamma)\left(\frac{\omega_0}{\Delta\omega}\right)^2\right) \quad \text{(Equation 1)}$$

Equation 1 may include the Coulomb constant (K), a temperature (T), the quality factor ($Q_l$ or Q), a value for the consumption of power ($P_{DC}$), current and voltage efficiency ($\alpha_I$ and $\alpha_V$, respectively), noise factor of a transistor ($\gamma$), a center frequency ($\omega_0$), and an offset frequency ($\Delta\omega$). Because many of these factors may be static or device- or environment-dependent, of these factors, the quality factor (Q) and $P_{DC}$, may be reasonably modified to reduce phase noise. Thus, increasing the quality factor (Q) and $P_{DC}$ may lower the phase noise overall.

To increase $P_{DC}$, the inductance L of the inductor 100 may be reduced. The inductance of the inductor 100 is directly correlated with the inner diameter 104 of the inductor 100. That is, as the inner diameter 104 shrinks, the inductance is reduced. Due to the series topology of the inductor 100, a total inductance of the inductor 100 is a sum of an inductance of the first series coil 102 and an inductance of the second series coil 108. As such, reducing the inner diameter 104 (e.g., of one or both coils) may lower the total inductance of the inductor 100, and increase $P_{DC}$, which may reduce phase noise. However, as the inner diameter 104 is reduced, the quality factor (Q) of the inductor 100 also decreases. This may lead to higher phase noise overall.

Figure 6:
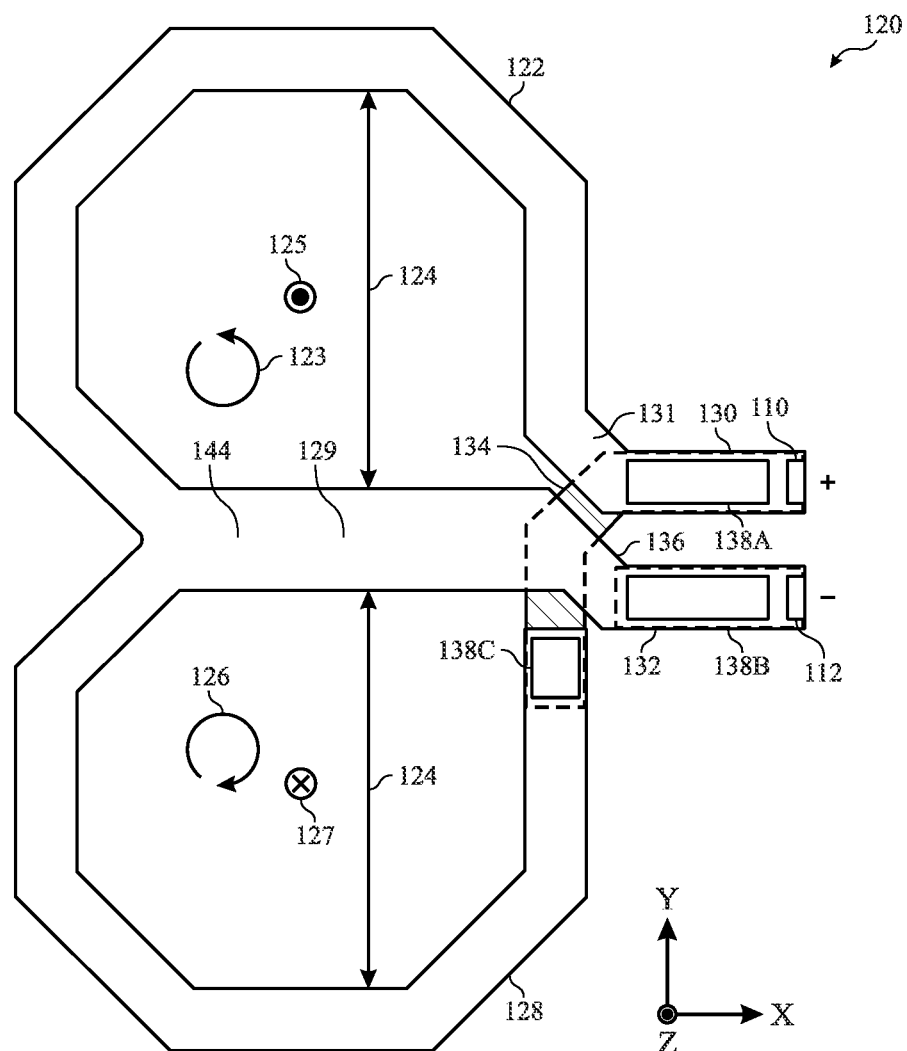
FIG. 6 illustrates an inductor with two coils in parallel in a figure-8 configuration, according to embodiments of the present disclosure.

With the foregoing in mind, FIG. 6 illustrates an inductor 120 with two coils in parallel in a figure-8 configuration, according to embodiments of the present disclosure. A first coil 122 may have an inner diameter 124. The inner diameter 124 of the first coil 122 may define an inductance L of the first coil 122. The inner diameter 124 may be greater than 1 micron, such as between 5 microns and 150 microns, 30 microns and 120 microns, 50 microns and 100 microns, 60 microns and 90 microns, and/or 70 microns and 85 microns. For example, the inner diameter 124 may be approximately 100 microns. When a current is applied by the positively polarized trace 110, the current may travel through the first coil 122 (e.g., in a counterclockwise direction 123) and return through a circuit path or shared branch 129 (e.g., that bisects the inductor 120) to produce a magnetic flux 125 (e.g., in a positive direction along the z-axis or "out of" the sheet or page of FIG. 6). The first coil 122 may be symmetrically disposed opposite of a second coil 128 with respect to the shared branch 129.

The second coil 128 may have an approximately identical inner diameter to the inner diameter 124. The inner diameter 124 of the second coil 128 may thus provide the same inductance L as the first coil 122. When a current is applied by the positively polarized trace 110, the current may also travel through the second coil 128 (e.g., in a clockwise direction 126 and at approximately the same time or simultaneously to the current traveling through the first coil 122) and return through the shared branch 129, producing a magnetic flux 127 having the same magnitude but in the opposite direction (e.g., in a negative direction along the z-axis or "into" the page or sheet of FIG. 6) as the magnetic flux 125 when the current is applied to the first coil 122. This may lead to flux cancellation of the magnetic fluxes 125, 127 produced by the current traveling through each coil 122, 128, respectively. In some embodiments, the current direction, and thus the directions of the magnetic fluxes 125, 127 along the z-axis of the first coil 122 and the second coil 128, may be switched. In alternative embodiments, the second coil 128 may have a different inner diameter from the inner diameter 124. While this may cause the second coil 128 to produce a magnetic flux having a different magnitude from the magnetic flux 127 when current is applied, additional circuitry or components may generate fluxes that compensate for the difference in the magnetic fluxes produced by each coil 122, 128.

In some embodiments, the first coil 122 and the second coil 128 may be directly coupled (without any intermediate circuitry or component) to the positively polarized trace 110 and the negatively polarized trace 112. When the inductor 120 is coupled in series, the positively polarized trace 110 may be coupled to a first circuit component, and the negatively polarized trace 112 may be coupled to a second circuit component. In particular, the first circuit component may provide an input signal having a current to the inductor 120 through the positively polarized trace 110, and the inductor 120 may reduce phase noise of the input signal to generate an output signal at the negatively polarized trace 112 to the second circuit component. In cases where the inductor 120 is coupled in parallel, the first circuit component and the second component may be a single component.

The first coil 122 and the second coil 128 may be coupled to the positively polarized trace 110 at a shared input 130, and the first coil 122 and the second coil 128 may be further coupled to the negatively polarized trace 112 at a shared output 132. The shared input 130 of the first coil 122 and the second coil 128 may include a connection 138A that couples to the first coil 122 and the second coil 128. That is, the connection 138A may be disposed between and/or include the x-y plane on which the first coil 122 is disposed and the x-y plane on which the second coil 128 is disposed. The shared output input 132 may include a connection 138B that couples to the first coil 122 and the second coil 128. That is, the connection 138B may be disposed between and/or include the x-y plane where the first coil 122 is disposed and the x-y plane where the second coil 128 is disposed. That is, the input 130 and the output 132 are shared between the first coil 122 and the second coil 128. From the shared input 130, the current may branch off or split to each coil 122, 128. The current may be rejoined at the shared output 132 via the shared branch 129 to couple to the negatively polarized trace 112. The second coil 128 may receive current from the input 130 via a junction 134 that is disposed underneath (e.g., on an x-y plane having a greater z-value than that of) a junction 136 coupling the shared branch 129 to the negatively polarized trace 112, though in some embodiments, the second coil 128 may be disposed above (e.g., on an x-y plane having a greater z-value than that of) the junction 136. The junction 134 may be coupled to the second coil 128 via a connection 138C. That is, the connection 138C may be disposed between and/or include the x-y plane on which the second coil 128 is disposed and the x-y plane on which the junction 134 is disposed. The first coil 122 may be described as "parallel" to the second coil 128 because the current enters the coils 122, 128 from the positively polarized trace 110, progresses through the coils 122, 128, and exits from the coils 122, 128 through the shared branch 129 and the negatively polarized trace 112 at approximately the same time (e.g., approximately simultaneously).

As illustrated, at least a portion of each of the first coil 122 and the second coil 128 may include an octagonal shape. For example, the portion of the octagonal shape of each of the first coil 122 and the second coil 128 may have six angles of 135° between seven sides, where one of the seven sides (part of the shared branch 129) may form a first line and another one of the seven sides (closest to the shared input 130) may form a second line that intersects the first line (e.g., at an angle of 90°). Indeed, each coil 122, 128 may have seven sides total.

Figure 7A:
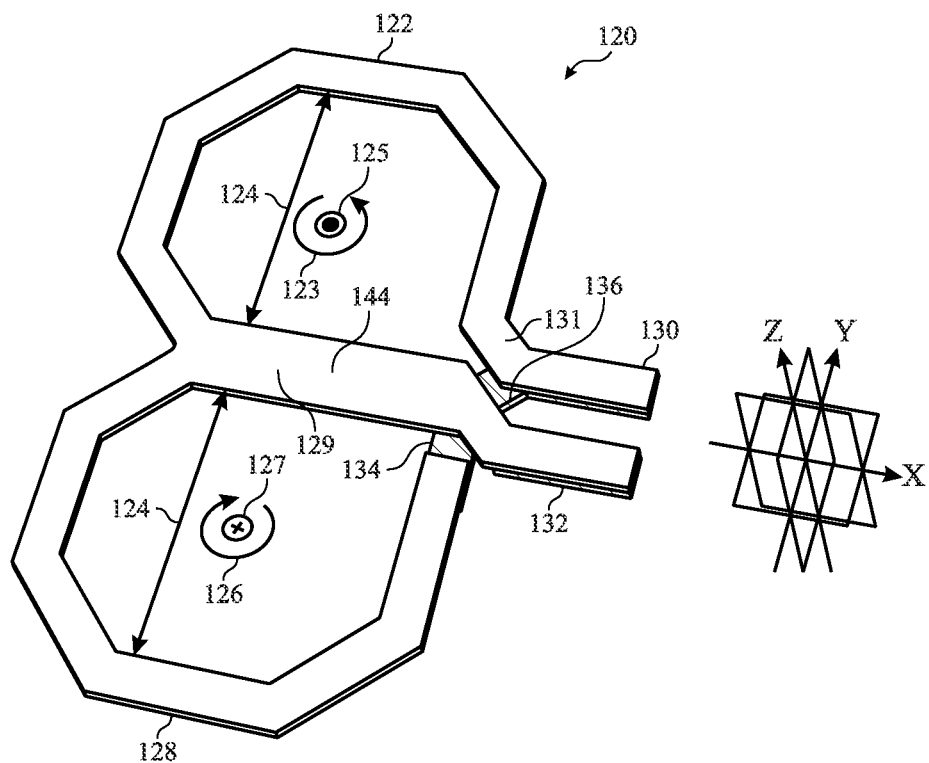
FIGS. 7A and 7B illustrate the inductor of FIG. 6 in three dimensions, according to embodiments of the present disclosure.
Figure 7B:
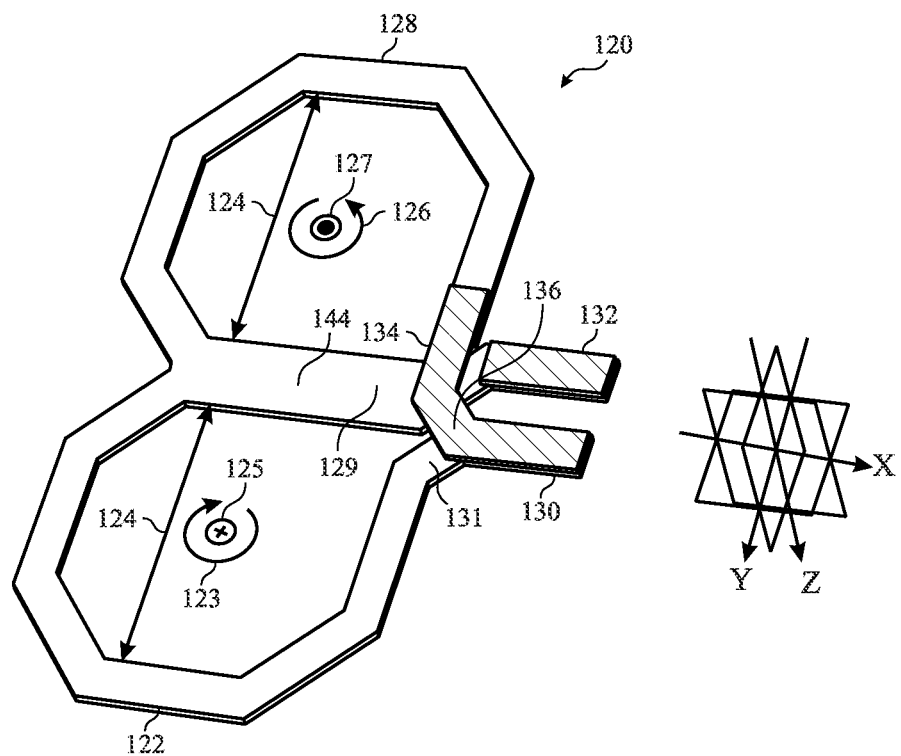

To further illustrate the topology of the inductor 120 with two coils in parallel, FIG. 7A and FIG. 7B illustrate the inductor 120 in FIG. 6 in three dimensions, according to embodiments of the present disclosure. FIG. 7A illustrates a top view of the inductor 120. As illustrated, the connection 131 of the first coil 122 to the input 130 is routed on a first x-y plane that is disposed above (e.g., having a greater z-value than that of) the junction 134 of the second coil 128 to the input 130. In particular, the connection 131 of the first coil 122 to the input 130 may be on the same level or x-y plane as the junction 136 coupling the shared branch 129 to the negatively polarized trace 112. In additional or alternative embodiments, the junction 134 of the second coil 128 to the input 130 may be disposed underneath (e.g., on an x-y plane that has a lesser z-value than that of) the connection 131 of the first coil 122 to the input 130 and the junction 136. Furthermore, the shared branch 129 may join current from each coil 122, 128 to the output 132 at a junction point 144 along the same level or x-y plane as that of the junction 136 coupling the shared branch 129 to the negatively polarized trace 112 and above (e.g., at a value greater positive along the z-axis) the junction 134 of the second coil 128 to the input 130. As such, the first coil 122 and the second coil 128 may be structured such that the connection 131 of first coil 122 to the input 130 and the junction 136 coupling the shared branch 129 to the negatively polarized trace 112 overlap. Moreover, as illustrated, the shared branch 129 overlaps the junction 136.

Furthermore, a metal of the inductor 120 may have a thickness that is suitable for transferring current and reducing a height of the inductor 120 to better fit within the electronic device 10, such as greater than 0.1 micron, such as between 0.1 micron and 10 microns, 0.5 microns and 5 microns, 1 microns and 4 microns, 2.5 microns and 3.8 microns, and/or 3 microns and 3.7 microns. Moreover, the metal of the connection 131 of the input 130 of the second coil 128 may have a thickness that is suitable for transferring current and reducing a height of the inductor 120 to better fit within the electronic device 10, such as greater than 0.01 micron, such as between 0.01 micron and 2.5 microns, 0.1 microns and 1.5 microns, 0.25 microns and 1 microns, and/or 0.5 microns and 0.8 microns. Additionally, the metal of the connection of the input 130 of the second coil 128 located at the junctions 134 and 136 may have a thickness that is suitable for transferring current and enabling the junctions 134 and 136 to overlap one another without resulting in an excessive height of the inductor 120, such as greater than 0.01 micron, such as between 0.01 micron and 2.5 microns, 0.1 microns and 1.5 microns, 0.25 microns and 1 microns, and/or 0.7 microns and 0.9 microns. In some embodiments, the metal of the inductor 120 may be replaced by any suitable conductive material.

As described above in FIG. 5, the first series coil 102 and the second series coil 108 of the inductor 100 are in series with one another. This may cause the total inductance L of the inductor 100 to be the sum of the inductance of both coils. In contrast, the topology of the inductor 120 in FIG. 6 that allows each input and output of the first coil 122 and the second coil 128 to couple directly (e.g., without intervening components or circuitry) to the positively polarized trace 110 and the negatively polarized trace 112, such that the first coil 122 and the second coil 128 are parallel with one another, and, as a result, the inductance of the inductor 120 may be determined using Equation 2 below:

$$L_{total} = \frac{L_1 \times L_2}{L_1 + L_2} \quad \text{(Equation 2)}$$

Equation 2 may define the total inductance ($L_{total}$) the inductor 120, the inductance of the first coil 122 ($L_1$), and the inductance of the second coil 128 ($L_2$). When the inductance of the first coil 122 ($L_1$) and the inductance of the second coil 128 ($L_2$) are equivalent, then the total inductance ($L_{total}$) the inductor 120 may be approximately half of the inductance of one of the coils.

The parallel figure-8 configuration of the inductor 120 may avoid disadvantages of other example configuration for inductors that do not use two coils in parallel. For example, in the case in which inputs of two coils are coupled to each other via a first resistor and outputs of the two coils coupled to one another via a second resistor, the two coils may be too far from one another to provide adequate flux cancellation of the magnetic flux created by current traveling in each respective coil. However, both coils may be coupled to one high-speed capacitor bank where the input and output of each coil are connected to one another.

In another example configuration, two coils may be located close by one another, but with the input and output of each coil facing in the opposite direction of one another. As such, the two coils may not be coupled together. The close proximity of the two coils may provide adequate flux cancellation of the magnetic flux created by current traveling in each respective coil. However, each coil may receive power from a respective high-speed capacitor bank asynchronously from one another. The high-speed capacitor banks may need to be synchronized with one another for adequate induction and performance of the inductor. In comparison, the parallel figure-8 configuration of the inductor 120 avoids the disadvantages inherent in these example configurations due to its topology.

With the foregoing in mind, FIG. 8 is a plot 150 showing inductances 152 and 154 of the inductor 100 of FIG. 5 and inductances 156 and 158 of the inductor 120 of FIG. 6, according to embodiments of the present disclosure. As illustrated in the plot 150, the x-axis represents the frequency (GHz) and the y-axis represents the inductance in henrys (H). The inductance 152 corresponds to the total inductance of the inductor 100 at 125° Celsius (C), the inductance 154 corresponds to the total inductance of the inductor 100 at 55° C., the inductance 156 corresponds to the total inductance of the inductor 120 at 125° C., and the inductance 158 corresponds to the total inductance of the inductor 120 at 125° C. As illustrated, the inductances 152, 154, 156, 158 generally increase as the corresponding frequency increase. In particular, at a certain frequency 151, the inductances of the inductor 100 and the inductor 120 may be similar. In one example, when the certain frequency 151 is approximately equal to 25.00 GHz, the inductances 152 and 154 may be 106.9128 picohenry (pH) and 106.3418 pH, respectively, and the inductances 156 and 158 may be 102.9843 pH and 102.5915 pH, respectively.

Figure 9:
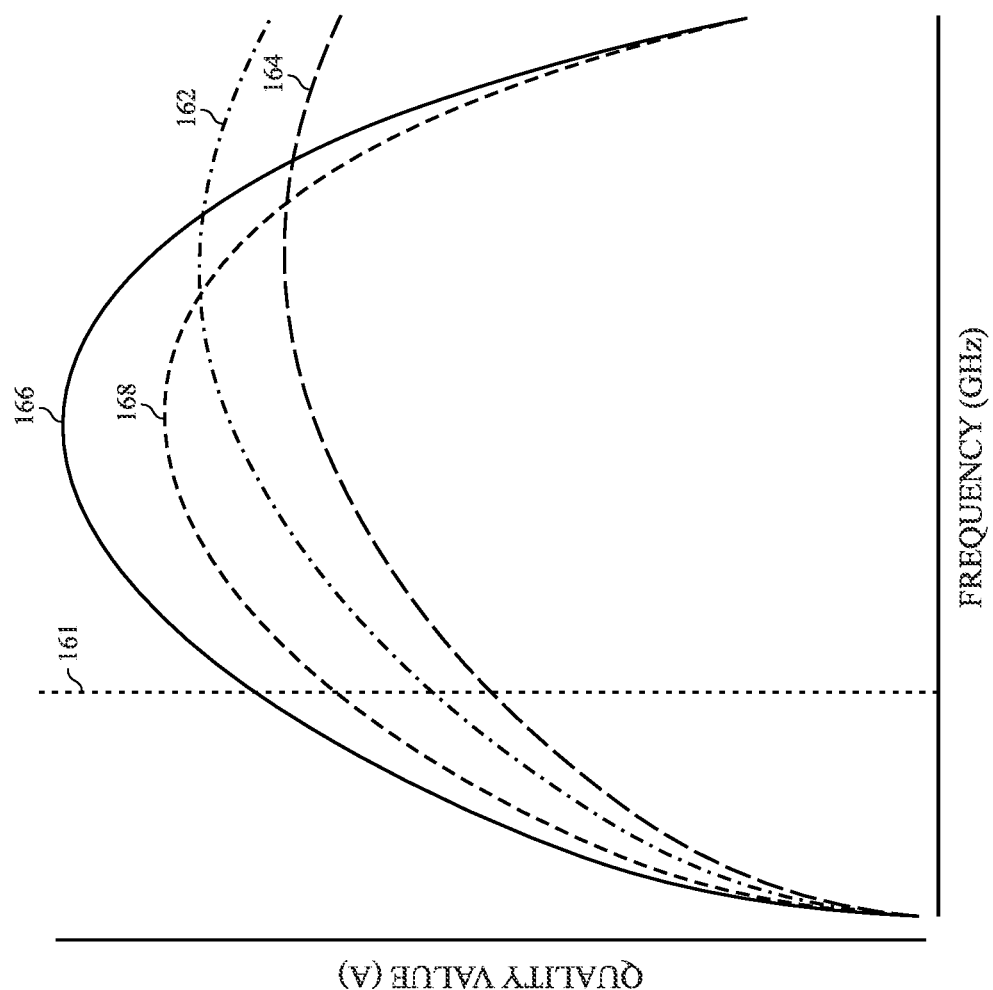
FIG. 9 is a plot showing quality factors of the inductor of FIG. 5 and quality factors of the inductor of FIG. 6, according to embodiments of the present disclosure.

FIG. 9 is a plot 160 showing quality factors 162 and 164 of the inductor 100 of FIG. 5 and quality factors 166 and 168 of the inductor of 120 of FIG. 6, according to embodiments of the present disclosure. As illustrated in the plot 160, the x-axis represents the frequency (GHz) and the y-axis represents the quality factor (Q). Further illustrated in the plot 160, the quality factor 162 of the inductor 100 at 125° C., the quality factor 164 of the inductor 100 at 55° C., the quality factor 166 of the inductor 120 at 125° C., and the quality factor 168 of the inductor 120 at 55° C. each illustrate temperature variation and sensitivity affecting the quality factor.

At a certain frequency 161, the quality factors 166 and 168 of the inductor 120 are greater than the quality factors 162 and 164 of the inductor 100. In one example, when the certain frequency 161 is approximately equal to 25.00 GHz, the quality factors 166 and 168 of the inductor 120 are 27.2649 and 23.9551, respectively, and the quality factors 162 and 164 of the inductor 100 are 20.0021 and 17.5877, respectively. Referring back to FIG. 7, both the inductor 100 and the inductor 120 have similar inductances at 25.00 GHz. Thus, the parallel coil configuration of the inductor 120 may achieve similar inductance while providing a greater overall quality factor when compared to the series coil configuration of the inductor 100 and, as a result, may achieve greater phase noise reduction (e.g., as evidence by Equation 1 above).

Figure 10:
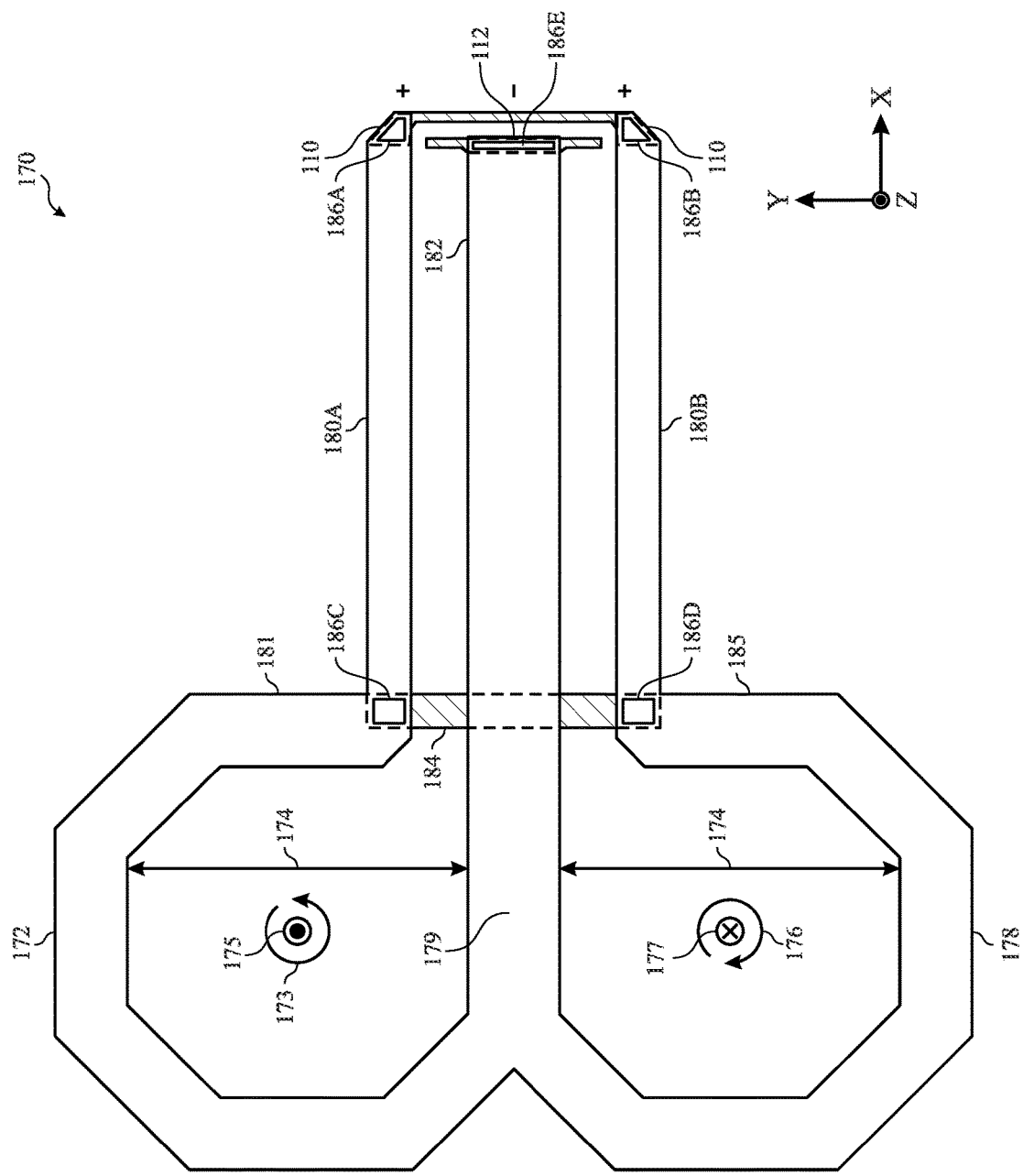
FIG. 10 illustrates an alternative configuration of a figure-8 parallel inductor, according to embodiments of the present disclosure.

In some embodiments, alternative configurations of the parallel coil configuration may be implemented in the transceiver 30. For example, FIG. 10 illustrates an alternative configuration of a parallel inductor 170, according to embodiments of the present disclosure. A first coil 172 of the inductor 170 may have an inner diameter 174. The inner diameter 174 of the first coil 172 may define the inductance L of the first coil 172. When current is applied from the positively polarized trace 110 to the first coil 172 (e.g., in a counterclockwise direction 173), the first coil 172 may produce a magnetic flux 175 (e.g., in a positive direction along the z-axis or "out of" the sheet or page of FIG. 10) The current may then return through a shared branch 179 to the negatively polarized trace 112. The first coil 172 may be symmetrically disposed opposite of a second coil 178 with respect to the shared branch 179.

The second coil 178 may have an approximately identical inner diameter to the inner diameter 174. As such, the inner diameter 174 of the second coil 178 may define the same inductance L as that of the first coil 172. When current is applied from the positively polarized trace 110 to the second coil 178 (e.g., in a clockwise direction 176), the second coil 178 may produce the magnetic flux 177 (e.g., in a negative direction along the z-axis or "into" the page or sheet of FIG. 10). The current may then return through the shared branch 179. The magnetic flux 175 of the first coil 172 may be equal in magnitude and opposite in direction to the magnetic flux 177 of the second coil 178. This may lead to flux cancellation of the magnetic flux 175, 177 produced by each coil, respectively. In some embodiments, the directions of the magnetic flux 175, 177 along the z-axis of the first coil 172 and the second coil 178, respectively, may be switched. In alternative embodiments, the second coil 178 may have a different inner diameter from the inner diameter 174. While this may cause the second coil 178 to produce a different magnetic flux from the magnetic flux 175, additional circuitry may compensate for the difference in the magnetic fluxes produced by each coil.

In some embodiments, the first coil 172 and the second coil 178 may be directly coupled (without any intermediate circuitry or component) to the positively polarized trace 110 and the negatively polarized trace 112. When the inductor 170 is coupled in series, the positively polarized trace 110 may be coupled to the first circuit component and the negatively polarized trace 112 may be coupled to the second circuit component. In particular, the first circuit component may provide an input signal having a current to the inductor 170 through the positively polarized trace 110, and the inductor 170 may reduce phase noise of the input signal to generate an output signal at the negatively polarized trace 112 to the second circuit component. In cases where the inductor 170 is coupled in parallel, the first circuit component and the second component may be a single component.

As illustrated in FIG. 10, a first input branch 180A of the first coil 172 and a second input branch 180B of the second coil 178 are each separately coupled to the positively polarized trace 110. That is, each coil 172, 178 has a direct and separate connection (e.g., without intervening or intermediate circuitry or components) to the positively polarized trace 110. This is compared to the configuration of the inductor 120 in FIG. 6, which uses the shared input 130 to couple the first coil 122 and the second coil 128 to the positively polarized trace 110. The input branches 180A, 180B of each coil 172, 178 may be co-extensive, aligned, or parallel with the shared branch 179.

In some embodiments, the positively polarized trace 110 may be disposed underneath (e.g., below or on an x-y plane that has a lesser z-value than that of) the input branches 180A and 180B. The positively polarized trace 110 may be coupled to the input branches 180A and 180B via a connection 186A and a connection 186B, respectively. That is, the connection 186A may be disposed between and/or include the x-y plane on which the input branch 180A is disposed and the x-y plane on which the positively polarized trace 110 is disposed. Similarly, the connection 186B may be disposed between and/or include the x-y plane on which the input branch 180B is disposed and the x-y plane on which the positively polarized trace 110 is disposed.

As a result of each coil 172, 178 having direct and separate connections (e.g., the input branches 180A, 180B) to the positively polarized trace 110, an input signal having a form of an alternative current (AC) voltage wave received from the positively polarized trace 110 may be split into two AC voltage waves, each traveling in a respective input branch 180A, 180B. Splitting the input signal in this manner may result in the two split AC voltage waves traversing the input branches 180A, 180B being out of phase with one another due to, for example, real world imperfections (e.g., manufacturing defects resulting in the input branches 180A, 180B not having the exact same dimensions, material composition, environmental conditions, and so on). This may cause circuitry coupled to the output of the inductor 170 to experience signal modulation issues, signal-to-noise ratio maximization issues, or other signal processing complications. To reduce or eliminate this phase misalignment, a coupler 184 may couple each of the input branches 180A, 180B for each coil 172, 178 together to ensure that the signals (e.g., AC voltage waveforms) in each input branch 180A, 180B is in-phase with one another. As illustrated, the coupler 184 may be orthogonal to or intersect the shared branch 179. That is, a transverse axis of the coupler 184 may be orthogonal to or intersect a transverse axis of the shared branch 179. The coupler 184 may be disposed underneath (e.g., is below or on an x-y plane that has a lesser z-value than that of) a connection 181 of the first coil 172 to the input 180. The coupler 184 may be connected to the first coil 172 via a connection 186C. That is, the connection 186C may be disposed between the x-y plane where the coupler 184 is disposed and the x-y plane where the first coil 172 is disposed. Similarly, the coupler 184 may be disposed underneath (e.g., is below or on an x-y plane that has a lesser z-value than that of) a connection 185 of the second coil 178 to the input 180. The coupler 184 may be connected to the second coil 178 via a connection 186D. That is, the connection 186D may be disposed between the x-y plane where the coupler 184 is disposed and the x-y plane where the second coil 178 is disposed.

Additionally, the first coil 172 and the second coil 178 may be coupled to the negatively polarized trace 112 at a shared output 182. That is, the output 182 is shared between the first coil 172 and the second coil 178. In some embodiments, the negatively polarized trace 112 may be disposed underneath (e.g., below or on an x-y plane that has a lesser z-value than that of) the shared output 182. The negatively polarized trace 112 may be coupled to the shared output 182 via a connection 186E. That is, the connection 186E may be disposed between and/or include the x-y plane on which the shared output 182 is disposed and the x-y plane on which the negatively polarized trace 112 is disposed.

From the input 180 of the first coil 172 and the second coil 178, the current may travel through the first coil 172 and the second coil 178. As previously described in some embodiments, the current may travel from only one input 180 of either the first coil 172 or the second coil 178 through the coupler 184 to the opposite coil. In any case, the current may be rejoined at the shared output 182 via the shared branch 179 and travel to the negatively polarized trace 112. The first coil 172 may be described as "parallel" to the second coil 178 because the current enters the coils 172, 178 from the positively polarized trace 110, progresses through the coils 172, 178, and exits from the coils 172, 178 through the shared output 182 via the shared branch 179 and the negatively polarized trace 112, at approximately the same time (e.g., approximately simultaneously).

As illustrated, at least a portion of each of the first coil 172 and the second coil 178 may include an octagonal shape. For example, the portion of the octagonal shape of each of the first coil 172 and the second coil 178 may have six angles of 135° between seven sides, where one of the seven sides (part of the shared branch 179) may form a first line and another one of the seven sides (closest to the input branches 180A, 180B) may form a second line that intersects the first line (e.g., at an angle of 90°). Indeed, each coil 172, 178 may have seven sides total.

Figure 11A:
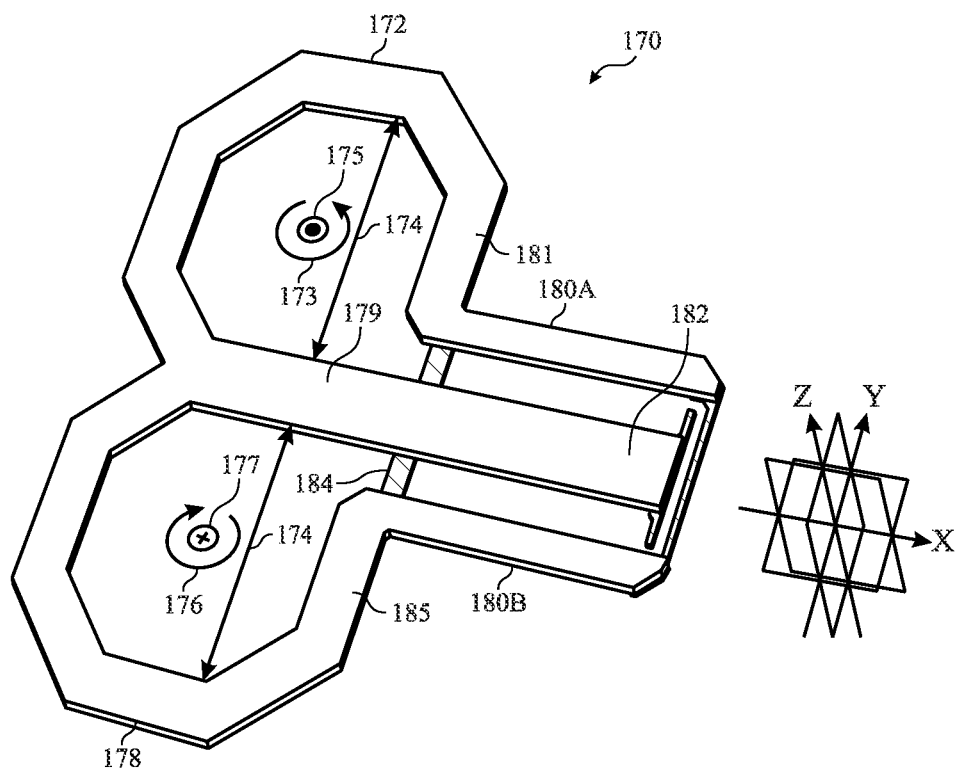
FIGS. 11A and 11B illustrate the inductor of FIG. 10 in three dimensions, according to embodiments of the present disclosure.
Figure 11B:
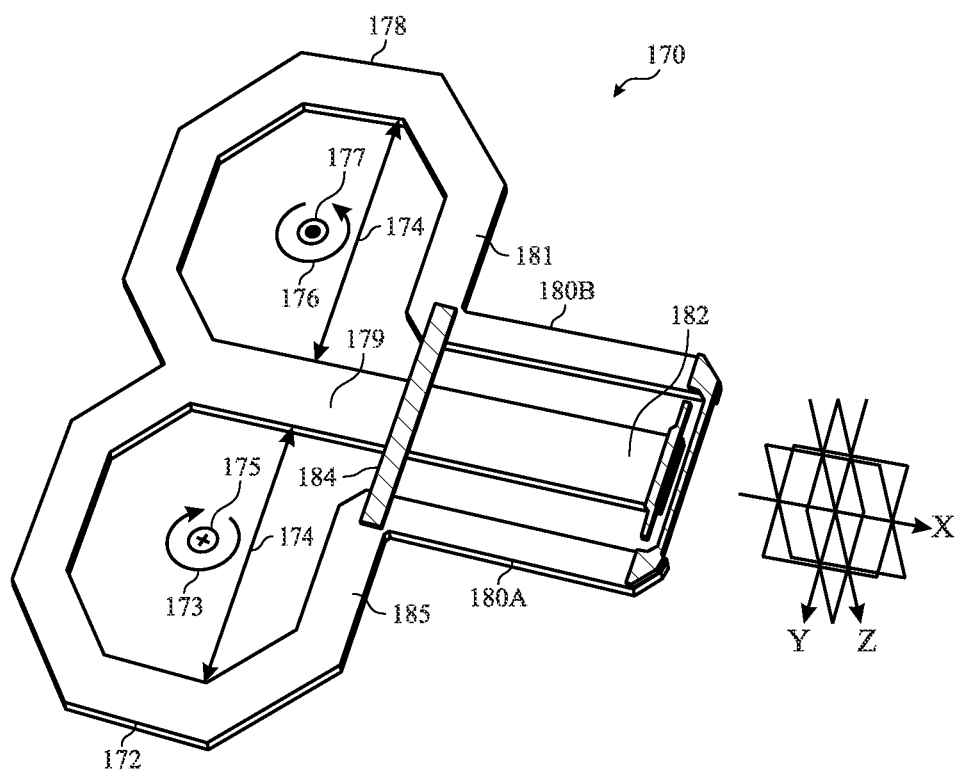

To further illustrate the configurations of the inductor 170 with two coils in parallel, FIG. 11A and FIG. 11B illustrate the inductor 170 in FIG. 10 in three dimensions, according to embodiments of the present disclosure. FIG. 11A illustrates a top view of the inductor 170 and FIG. 11A illustrates a bottom view of the inductor 170. The connection 181 of the first coil 172 to the input 180 overlaps (e.g., is above or on an x-y plane that has a greater z-value than that of) the coupler 184. In particular, the connection 181 of the first coil 122 to the input 130 may be on the same level or x-y plane as the connection 185 of the second coil 178 to the input 180 and the shared branch 179 where the first coil 172 and the second coil 178 converge. The coupler 184 may couple the inputs 180 of each coil 172, 178 and provide the current from the positively polarized trace 110 to the inputs 180. As such, the first coil 172 and the second coil 178 may be structured such that the connection 181 of the first coil 172 to the input 180, the connection 185 of the second coil 178 to the input 180, and the shared branch 179 each overlap the coupler 184.

Furthermore, the metal of the inductor 170 may have a thickness that is suitable for transferring current and reducing a height of the inductor 170 to better fit within the electronic device 10, such as greater than 0.1 micron, such as between 0.1 micron and 10 microns, 0.5 microns and 5 microns, 1 microns and 4 microns, 2.5 microns and 3.8 microns, and/or 3 microns and 3.7 microns. The metal of the coupler 184 may have a thickness greater than 0.01 micron, such as between 0.01 micron and 2.5 microns, 0.1 microns and 1.5 microns, 0.25 microns and 1 microns, and/or 0.5 microns and 0.8 microns. The metal of the inductor 170 may include or be replaced by any suitable conductive material.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. An inductor comprising
   a first terminal,
   a second terminal,
   a shared branch coupled to the second terminal,
   a first coil coupled to the first terminal that extends in a first direction from the first terminal to the shared branch, and
   a second coil coupled to the first terminal via a junction that overlaps the shared branch, the second coil extending in a second direction opposite the first direction from the first terminal to the shared branch, the first coil being symmetrical with the second coil about the shared branch.

2. The inductor of claim 1, wherein the shared branch joins the first coil and the second coil.

3. The inductor of claim 1, wherein the first coil and the second coil have a same diameter.

4. The inductor of claim 1, wherein the first coil is coupled to the first terminal via a first input branch, and the second coil is coupled to the first terminal via a second input branch.

5. The inductor of claim 4, wherein the first input branch and the second input branch are co-extensive with the shared branch.

6. The inductor of claim 4, comprising a coupler coupling the first input branch to the second input branch, wherein a transverse axis of the coupler intersects a transverse axis of the shared branch.

7. The inductor of claim 6, wherein the shared branch overlaps the coupler.

8. An electronic device, comprising:
one or more antennas; and
a transceiver coupled to the one or more antennas, the transceiver comprising first circuitry,
second circuitry, and
an inductor having, a first coil and a second coil coupled to the first circuitry, the second coil coupled to the first circuitry via a junction, and a shared branch coupled to the first coil and the second coil that bisects the inductor, the shared branch overlapping the junction and coupled to the second circuitry, the first coil in parallel with the second coil.

9. The electronic device of claim 8, wherein the inductor is configured to reduce a phase noise generated by the first circuitry.

10. The electronic device of claim 8, wherein the first coil produces a first magnetic field and the second coil produces a second magnetic field when current is applied to the inductor, wherein the first magnetic field is approximately equal in magnitude and opposite in direction to the second magnetic field.

11. The electronic device of claim 8, wherein the first coil and the second coil are each at least partially octagonal in shape.

12. The electronic device of claim 8, wherein the first coil and the second coil each comprise seven sides.

13. The electronic device of claim 12, wherein each of the seven sides forms a 135 degree angle with another of the seven sides.

14. The electronic device of claim 12, wherein one of the seven sides comprises the shared branch.

15. A voltage-controlled oscillator, comprising
a first circuit component,
a second circuit component, and
an inductor comprising a first coil coupled to the first circuit component, a second coil coupled to the first circuit component via a junction and being in parallel with the first coil, and a shared circuit path coupled to the second circuit component, the first coil, and the second coil, the shared circuit path overlapping the junction.

16. The voltage-controlled oscillator of claim 15, wherein the inductor is configured to receive a first signal from the one of the first circuit component and generate a second signal with less phase noise than the first signal.

17. The voltage-controlled oscillator of claim 16, wherein the inductor is configured to output the second signal to the second circuit component.

18. The voltage-controlled oscillator of claim 15, wherein the first coil is coupled to the first circuit component via a first input, wherein the first input overlaps the junction coupling the second coil to the first circuit component.

19. The voltage-controlled oscillator of claim 15, wherein the first coil and the second coil have a same diameter.

20. The voltage-controlled oscillator of claim 15, wherein the first coil and the second coil are each at least partially octagonal in shape.

* * * * *